United States Patent
Saggio et al.

(10) Patent No.: US 6,841,836 B2
(45) Date of Patent: Jan. 11, 2005

(54) INTEGRATED DEVICE WITH SCHOTTKY DIODE AND MOS TRANSISTOR AND RELATED MANUFACTURING PROCESS

(75) Inventors: Mario Saggio, Acicastello (IT); Ferruccio Frisina, Agata li Battiati (IT)

(73) Assignee: STMicroelectronics, S.R.L., Agrate Brianza (IT)

( * ) Notice: Subject to any disclaimer, the term of this patent is extended or adjusted under 35 U.S.C. 154(b) by 0 days.

(21) Appl. No.: 10/738,952

(22) Filed: Dec. 16, 2003

(65) Prior Publication Data

US 2004/0140512 A1 Jul. 22, 2004

(30) Foreign Application Priority Data

Dec. 20, 2002 (IT) ...................................... MI2002A2700

(51) Int. Cl.[7] .............................................. H01L 29/72
(52) U.S. Cl. ...................... 257/401; 257/155; 257/331; 257/341; 257/342; 257/402; 257/403
(58) Field of Search ................................ 257/401, 155, 257/331, 341, 342, 402, 403

(56) References Cited

U.S. PATENT DOCUMENTS 5,886,383 A    3/1999  Kinzer
6,049,108 A  * 4/2000  Williams et al. ............ 257/341

* cited by examiner

Primary Examiner—Edward Wojciechowicz
(74) Attorney, Agent, or Firm—Carol W. Burton, Esq.; William J. Kubida, Esq.; Hogan & Hartson L.L.P.

(57) ABSTRACT

An integrated device comprising a MOS transistor and a Schottky diode which are formed on a semiconductor substrate of a first conductivity type is shown. The device comprises a plurality of body region stripes of a second conductivity type which are adjacent and parallel to each other, a first metal layer placed over said substrate and a second metal layer placed under said substrate. The device comprises a plurality of elementary structures parallel to each other each one of which comprises first zones provided with a silicon oxide layer placed over a portion of the substrate which is comprised between two adjacent body region stripes, a polysilicon layer superimposed to the silicon oxide layer, a dielectric layer placed over and around the polysilicon layer. Some body region stripes comprise source regions of the first conductivity type which are placed adjacent to the first zones of the elementary structures to form elementary cells of said MOS transistor. The elementary structures and the body regions stripes extend longitudinally in a transversal way to the formation of the channel in the elementary cells of the MOS transistor and the first metal layer contacts the source regions. At least one elementary structure comprises at least a second zone adapted to allow the direct contact between the first metal layer and the underlying substrate portion arranged between two adjacent body regions stripes to perform the Schottky diode.

7 Claims, 6 Drawing Sheets

INTEGRATED DEVICE WITH SCHOTTKY DIODE AND MOS TRANSISTOR AND RELATED MANUFACTURING PROCESS

BACKGROUND OF THE INVENTION

1. Field of the Invention

The present invention refers to an integrated device with Schottky diode and MOS transistor and to the related manufacturing process.

2. Relevant Background

The MOS devices are frequently used as synchronous rectifiers, for example in the bridge circuit configurations of the DC/DC converters. A synchronous rectifier acts like a diode: it is turned on when its equivalent diode has to conduct and it is turned off when the equivalent diode has to cease the conduction. The vertical semiconductor MOS devices have an intrinsic diode, which is formed by the junction between the body region and the drain region and which is called "body diode", that interferes with the operation of the MOS device as a synchronous rectifier. In fact such body diode switches slowly, it has a high conduction voltage and may product electromagnetic radiation emissions in the circuit configurations where the MOS device is inserted.

For reducing the switching time of the body diode technologies for controlling the life time of the minority carriers are presently used which consist of introducing metal, as gold or platinum, inside the MOS device. Such technologies cause a reduction of the life time of the minority carriers, increase the conduction losses and do not decrease the electromagnetic radiation emissions in the circuit configurations where the MOS device is inserted.

Another solution used for reducing the switching time of the body diode consists of arranging a Schottky diode, which has equal voltage and a suitable area, in parallel thereto. The Schottky diode has a fast recovery because minority carriers do not exist and has lower conduction voltage values for the different barrier heights. The combination of the body diode in parallel to the Schottky diode provides for an equivalent structure having a short switching time and a lower conduction voltage.

Discrete component structures are used for the structure made up by the body diode in parallel to the Schottky diode.

An integrated type structure is disclosed in U.S. Pat. No. 5,886,383. In such patent there is the device structure shown in FIG. 1. A MOS device having a polygonal cell structure is formed together with a Schottky diode in a common silicon substrate of N+-type. A N-type epitaxial layer 100 is formed on the said silicon substrate which receives a plurality of P-type regions 41 and 42 which comprise source regions 140 and 150 and which have central openings 44 and 45 through which the region 100 protrudes, so that a metal layer 220 contacts the region 100; in such a way the diode Schottky is formed. In the structure in FIG. 1 each channel region is covered by a gate oxide on which a polysilicon layer 200 is superimposed. Another oxide layer 210 is superimposed on the polysilicon layer for insulating it from the metal layer 220. A drain electrode is applied under the chip 90.

Therefore the Schottky diode in the MOS device in FIG. 1 is formed by interrupting the body regions of the single elementary cells of the device, by forming an alternation of body regions and device substrate portions; said substrate portions are contacted by the metal used for contacting the source regions.

Such solution, even if it is efficacious, gives the problem of the interruption of the body regions in the MOS elementary cells and results unusable in certain cases, as, for example, in MOS devices having multi-drain structures (MD), that is where the body regions extend in depth inside the substrate of the MOS device.

SUMMARY OF THE INVENTION

In view of the art described, it is an object to present invention to provide an integrated device with Schottky diode and MOS transistor which overcomes the aforementioned drawbacks.

According to the present invention, this object is obtained by means of an integrated device and process for forming the same including a MOS transistor and a Schottky diode which are formed on a semiconductor substrate of a first conductivity type, said device comprising a plurality of body region stripes of a second conductivity type which are adjacent and parallel to each other, a first metal layer placed over said substrate and a second metal layer placed under said substrate, said device comprising a plurality of elementary structures parallel to each other each one of which comprises first zones provided with a silicon oxide layer placed over a portion of said substrate which is comprised between two adjacent body region stripes, a polysilicon layer superimposed to said silicon oxide layer, a dielectric layer placed over and around the polysilicon layer, some stripes of said plurality of adjacent body region stripes comprising source regions of the first conductivity type which are placed adjacent to said first zones of the elementary structures to form elementary cells of said MOS transistor, said elementary structures and said body regions stripes extending longitudinally in a transversal way to the formation of the channel in said elementary cells of the MOS transistor, said first metal layer contacting said source regions, characterized in that at least one elementary structure of said plurality of elementary structures comprises at least a second zone adapted to allow the direct contact between said first metal layer and the underlying substrate portion arranged between two adjacent body regions stripes to perform the Schottky diode.

BRIEF DESCRIPTION OF THE DRAWINGS

The features and the advantages of the present invention will be made evident by the following detailed description of embodiments thereof, shown as not limiting examples in the annexed drawings, wherein.

DETAILED DESCRIPTION

Figure 2:
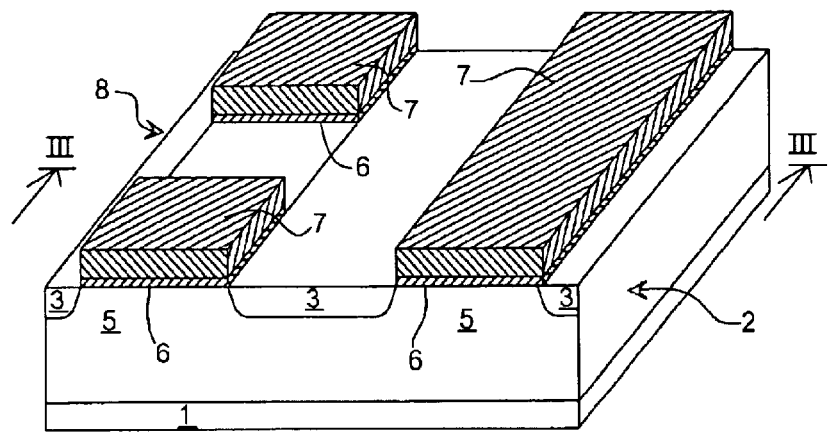
FIG. 2 is a perspective schematic view of a part of an integrated device according to a first embodiment of the present invention at one step of its manufacturing process.
Figure 3:
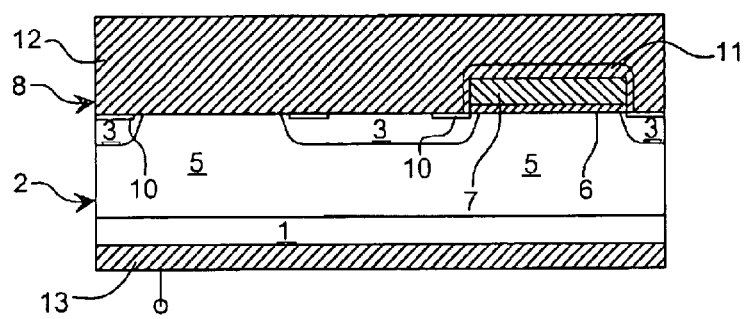
FIG. 3 is a section view of the device in FIG. 2 according to a line 111—111 at a successive step of the process for manufacturing the integrated device.

Referring to FIGS. 2–3, an integrated device according to a first embodiment of the invention is shown. The integrated device has a stripe structure. An N-type epitaxial layer 2 with low dopant concentration is grown on a N-type substrate 1 with high dopant concentration. A plurality of body region stripes 3 having P-type dopant are formed inside the epitaxial layer 2. The body region stripes 3 are adjacent and parallel to each other and they are alternated with portions 5 of the epitaxial layer 2, as shown in FIG. 2. Over the plurality of portions 5 of the epitaxial layer 2 a silicon oxide layer 6 is placed and a polysilicon layer 7 is placed over the silicon oxide layer 6 (FIGS. 2 and 3); the layers 6 and 7 have a stripe shape and the stripes are parallel to each other and form a plurality of elementary structure of the integrated device.

The succession of the steps of the integrated device manufacturing process continues with a successive masking and etch step of the polysilicon 7 and of the silicon oxide 6 of at least one elementary structure, that is of at least one polysilicon stripe 7 and of the underlying silicon oxide layer 6, on at least one zone 8. The masking and the etch of the polysilicon 7 and of the silicon oxide 6 are made up for forming an interruption of the elementary structure, that is of the polysilicon stripe 7 and of the underlying silicon oxide stripe 6, for the entire width of the stripes.

At successive steps of the manufacturing process of the integrated device the regions 10 with high dopant concentration of N-type are formed. The method includes a step for the thermal diffusion of the P dopant of the body regions 3 so that they extend partially under the silicon oxide stripes 6 (FIG. 3).

Successive steps provide for the formation of a dielectric layer 11 over and around the silicon oxide layers 6 and the polysilicon layers 7, for the deposition of a metal layer 12 and for the formation of a metal layer 13 on the bottom surface of the substrate 1. The metal layer 12 is deposited over the zones 8 for contacting the silicon of the portions 5 of the epitaxial layers 2; in such a way Schottky diodes are formed in the zones 8 of the integrated device the electrodes of which are constituted by the metal layers 12 and 13. MOS elementary cells (wherein for MOS elementary cell it is intended the block constituted by two source regions 10, a portion 5 of the epitaxial layer 2 and a gate structure formed by the layers 6 and 7) are formed in the other zones which form the MOS power transistor. The metal layers 12 and 13 are respectively the source and drain electrodes of each MOS elementary cell. The formation of the channel of said MOS elementary cells occurs in a transversal way with respect to the longitudinal extension of the body stripes 3 and of the elementary structures formed by the stripes 6 and 7.

Figure 7:
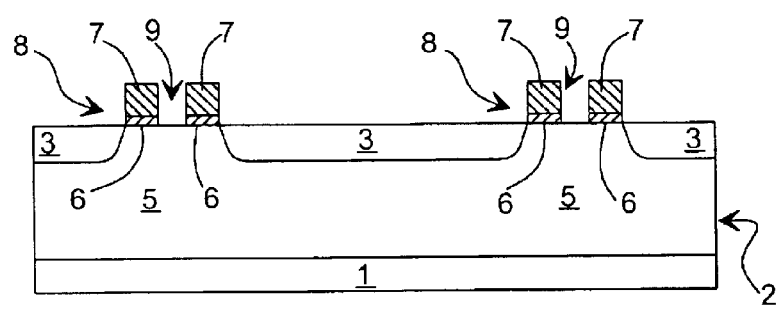
FIG. 7 is a section view of the device in FIG. 4 through line VII—VII.
Figure 8:
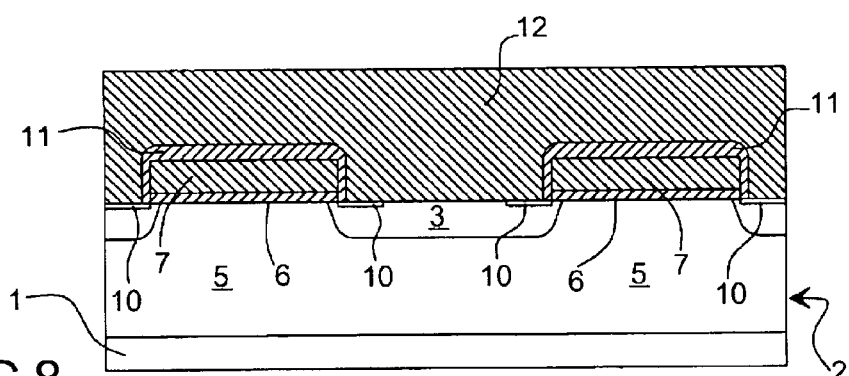
FIGS. 8 and 9 are views analogous to those in FIGS. 6 and 7 but in a successive step of the manufacturing process of the device.
Figure 9:
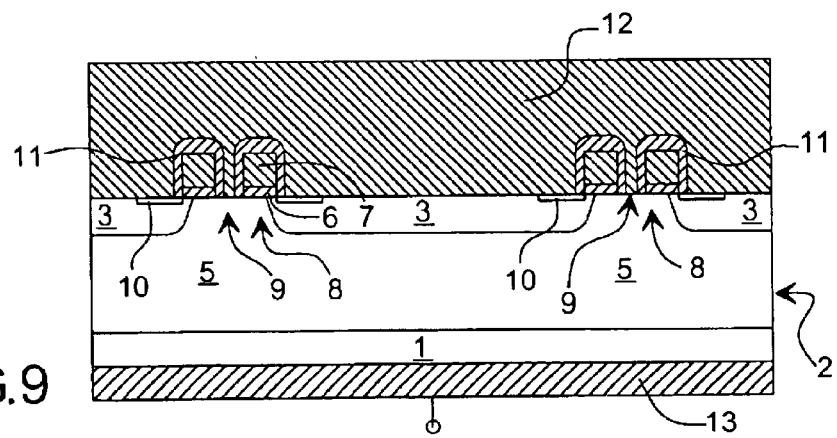

In FIGS. 4, 6–9 an integrated device according to a second embodiment of the present invention is shown which differs from the first embodiment because the masking and etch step of the polysilicon 7 and of the silicon oxide 6 of at least one elementary structure, that is of at least one polysilicon stripe 7 and at least one silicon oxide stripe 6, in the zone 8 does not provide the whole removal of the oxide and of the polysilicon in said zone 8. In fact in the zone 8 an opening 9 (for example comprised between 1 μm and 5 μm) in the polysilicon layer 7 and in the underlying silicon oxide layer 6 (FIGS. 4 and 7) is formed to allow the contact of the metal layer 12 with the underlying portion 5 of epitaxial layer 2 (FIGS. 8 and 9). The dielectric layer 11 covers the walls of the opening 9 to prevent the contact of the metal 12 with the polysilicon 7.

Figure 4:
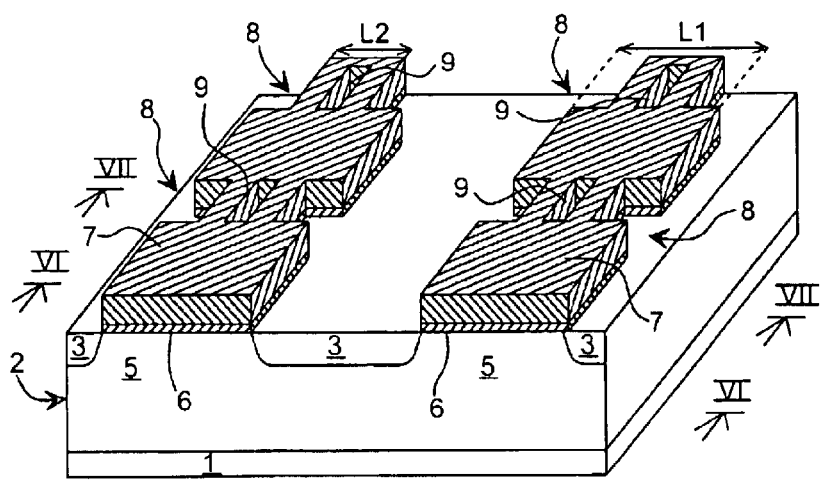
FIG. 4 is a perspective schematic view of a part of an integrated device according to a second embodiment of the present invention at one step of its manufacturing process.
Figure 6:
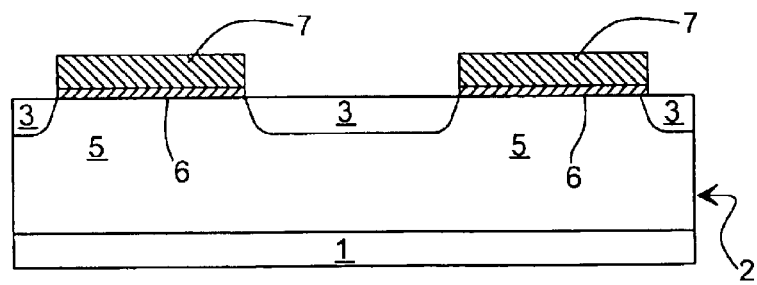
FIG. 6 is a section view of the device in FIG. 4 through line VI—VI.

The width L2 of the stripes 6 and 7 in the zones 8 is preferably smaller than the typical width L1 of the stripes 6 and 7, as shown in FIG. 4; it is defined in base on the breakdown voltage of the integrated device which is not lower than that of the integrated device without Schottky diodes, therefore the width L2 depends on the dopant concentration of the regions 3, on the thickness of the oxide, etc. With the width L2 smaller than the width L1 (for example if L1=11 μm, L2 is comprised between 5 μm and 8 μm), at the thermal diffusion step of the P dopant of the body regions 3, after forming a suitable implant window, an alignment of said body regions 3 with the portion of the silicon oxide 6 of the zone 8 occurs so that portions of epitaxial layer 2 are not between the body regions 3 and the beginning of the layer 6, as shown in FIG. 7.

Preferably different zones 8 in more than one elementary structure are formed; said zones 8 are preferably aligned transversal to each other and are alternated longitudinally to the MOS elementary cells, as shown in FIG. 4.

Figure 5:
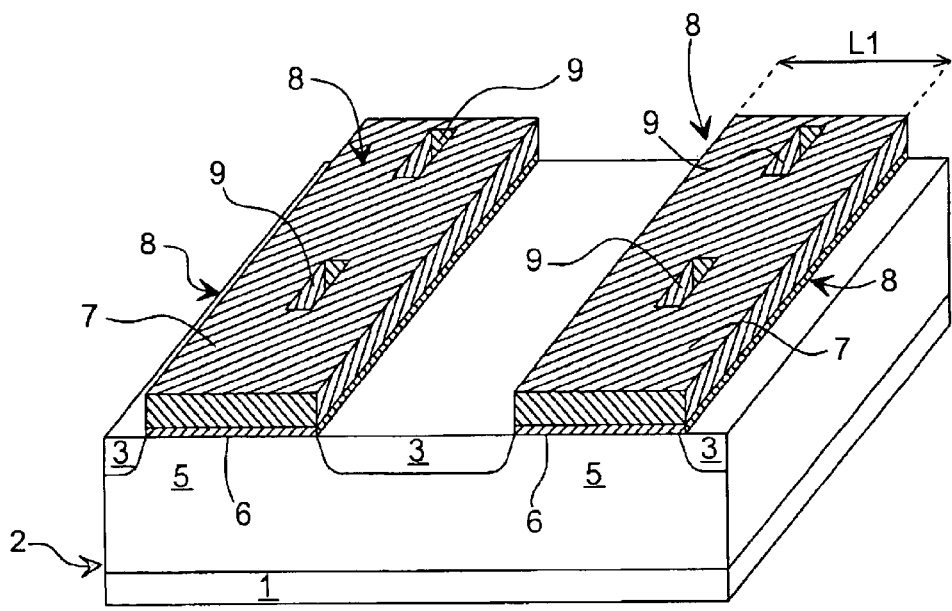
FIG. 5 is a perspective schematic view of a part of an integrated device according to a variant of the second embodiment of the present invention at one step of its manufacturing process.

In the variant of the second embodiment shown in FIG. 5 the only difference consists in that the width L2 of the stripes 6 and 7 of the zones 8 is equal to the typical width L1 of the stripes 6 and 7.

The integrated device is therefore formed by a MOS power transistor and by a Schottky diode arranged in parallel to the body diode.

Figure 10:
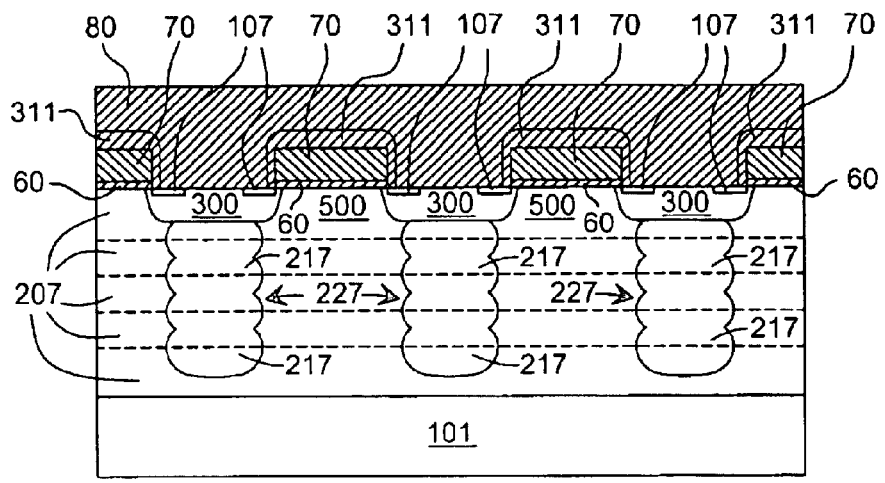
FIG. 10 is a cross-section view of a part of a multi-drain device according to prior art.

A part of a multi-drain device according to prior art is shown in FIG. 10. The integrated device in FIG. 10 presents a multi-drain (MD) device structure, that is it presents a formation of P-type region columns under the body regions 300. A succession of N-type epitaxial layers 207 with low dopant concentration are formed on a N-type semiconductor substrate 101 with high dopant concentration. After the formation of each epitaxial layer 207 of the succession of epitaxial layers 207 it occurs the implant of P-type regions 217 inside said epitaxial layer 207, the formation of another epitaxial layer 207 and the diffusion of the P dopant of the regions 217. After the formation of the last epitaxial layer 207 of the succession of epitaxial layers 207 columns 227 of the P-type regions 217 are formed.

A plurality of stripes of body regions 300 having P-type dopant is formed inside the last epitaxial layer 207; the body region stripes 300 are adjacent and parallel to each other and they are alternated to portions 500 of the last epitaxial layer 207, as shown in FIG. 10. At least one source region 107 is inside each body stripes 300. A silicon oxide layer 60 is placed over the plurality of regions 500 of the last epitaxial layer 207 and a polysilicon layer 70 is placed over the silicon oxide layer 60; the layers 60 and 70 have shape of stripes which are parallel to each other and which form a plurality of elementary structure of the integrated device. A stripe shape dielectric layer 311 is placed over the polysilicon layers 70 and a metal layer 80 is deposited over the layers 311, over the body regions 300 and over the source regions 107.

Figure 1:
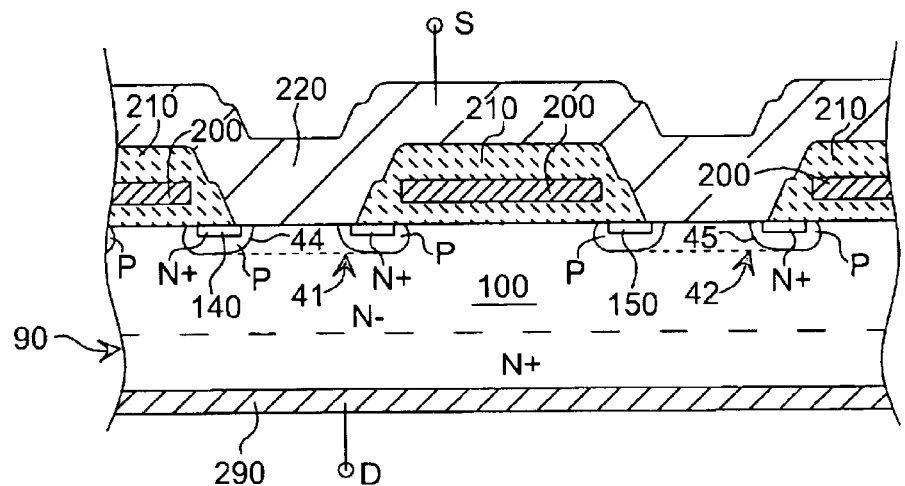
FIG. 1 is a cross-section schematic view of a part of a device according to prior art.

In the device in FIG. 10 a Schottky diode cannot be formed by interrupting the body regions 300 of the single elementary cells of the device and by forming an alternation of body regions and portions of the substrate of the device as shown in the device in FIG. 1.

Figure 11:
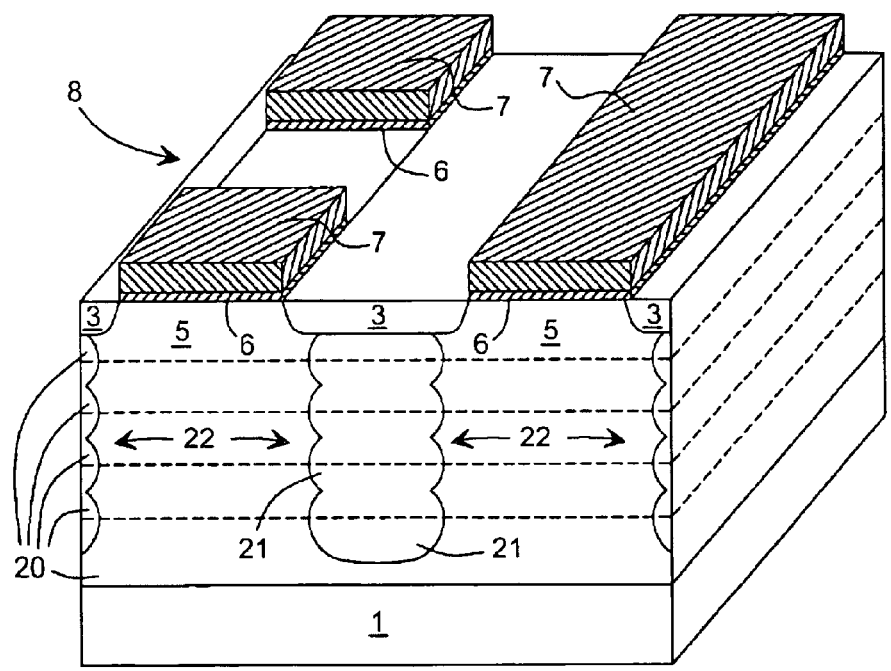
FIG. 11 is a perspective schematic view of a part of an integrated device according to a third embodiment of the present invention at one step of its manufacturing process.

In FIG. 11 an integrated device according a third embodiment of the invention is shown where the elements, which are equal to those of the integrated devices according to the preceding embodiments of the invention which are shown in FIGS. 2–9, have been indicated by the same number references; said integrated device presents a stripe structure. In different way from the integrated devices of the preceding embodiments of the invention the integrated device in FIG. 11 shows a multi-drain (MD) device structure, that is it shows a formation of P-type columns under the body regions 3. A succession of N-type epitaxial layers 20 with low dopant concentration is formed on a N-type semiconductor substrate 1 with high dopant concentration. After the formation of each epitaxial layer 20 of the succession of epitaxial layers 20 it occurs the implant of P-type regions 21 inside said epitaxial layer 20, the formation of another epitaxial layer 20 and the diffusion of the P dopant of the regions 21. After the formation of the last epitaxial layer 20 of the succession of epitaxial layers 20 columns 22 of the P-type regions 21 are formed. Typically a portion of epitaxial layer 20 is placed between the substrate 1 and the below of the columns 22 but it is even possible that the below of the columns 22 is directly contacted by the substrate 1.

A plurality of body region stripes 3 having P-type dopant is formed inside the last epitaxial layer 20; the body region stripes 3 are adjacent and parallel to each other and they are alternated to portions 5 of the last epitaxial layer 20, as shown in FIG. 11. A silicon oxide layer 6 is placed over the plurality of regions 5 of the last epitaxial layer 20 and a polysilicon layer 7 is placed over the silicon oxide layer 6; the layers 6 and 7 have shape of stripes parallel to each other and they form a plurality of elementary structures of the integrated device.

The succession of the steps of the integrated device manufacturing process follows with a successive masking and etch step of the polysilicon 7 and of the silicon oxide 6 of at least one elementary structure, that is of at least one polysilicon stripe 7 and of the underlying silicon oxide layer 6, on at least one zone 8. The masking and the etch of the polysilicon 7 and of the silicon oxide 6 is made up for forming an interruption of the elementary structure, that is of the polysilicon stripe 7 and of the underlying silicon oxide stripe 6, for the entire width of the stripes.

At successive steps of the manufacturing process of the integrated device the regions 10 with high dopant concentration of N-type are formed and there is a step for the thermal diffusion of the P dopant of the body regions 3 so that they extend partially under the silicon oxide stripes 6.

Successive steps provide for the formation of a dielectric layer 11 over and around the silicon oxide layers 6 and the polysilicon layers 7, for the deposition of a metal layer and for the formation of a metal layer on the bottom surface of the substrate 1 (which are not shown in FIG. 11). The metal layer present over the top surface of the device is deposited over the zones 8 for contacting the silicon of the portions 5 of the epitaxial layer 20; in such a way Schottky diodes are formed in the zones 8 of the integrated device the electrodes of which are constituted by the metal layers present over the top and bottom device surfaces. MOS elementary cells (wherein for MOS elementary cell it is intended the block constituted by two source regions 10, a portion 5 of the epitaxial layer 2 and a gate structure formed by the layers 6 and 7) are formed in the other zones which form the MOS power transistor. The metal layers present over the top and bottom device surfaces are respectively the source and drain electrodes of each MOS elementary cell. The formation of the channel of said MOS elementary cells occurs in a transversal way with respect to the longitudinal extension of the body stripes 3 and of the elementary structures formed by the stripes 6 and 7.

Figure 12:
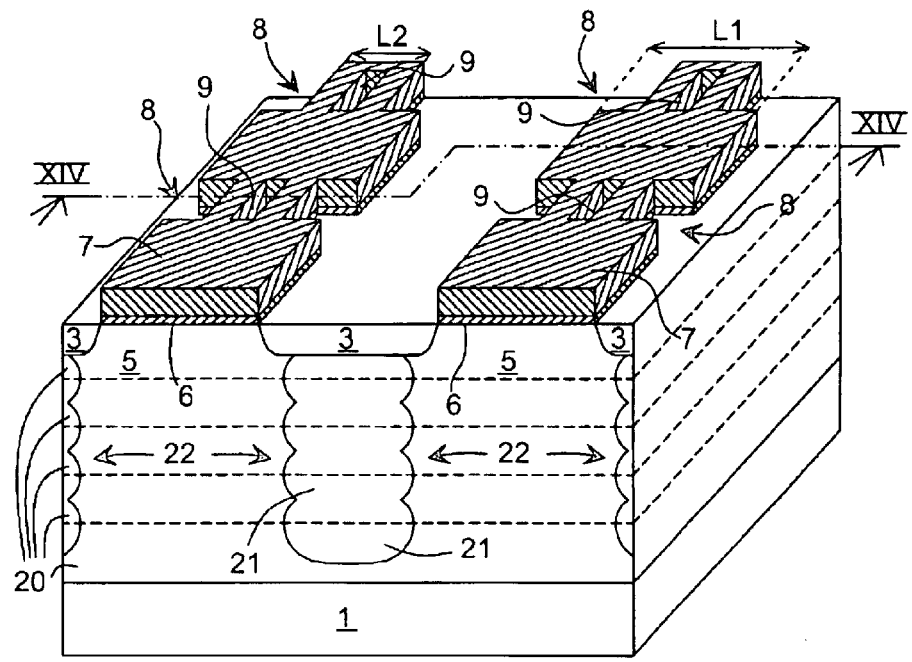
FIG. 12 is a perspective schematic view of a part of an integrated device according to a fourth embodiment of the present invention at one step of its manufacturing process.
Figure 14:
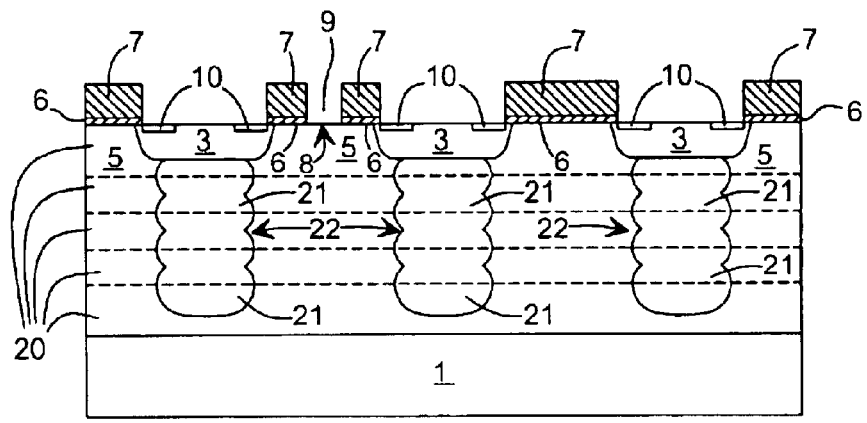
FIG. 14 is a section view of the device in FIG. 12 through line XIV—XIV.
Figure 15:
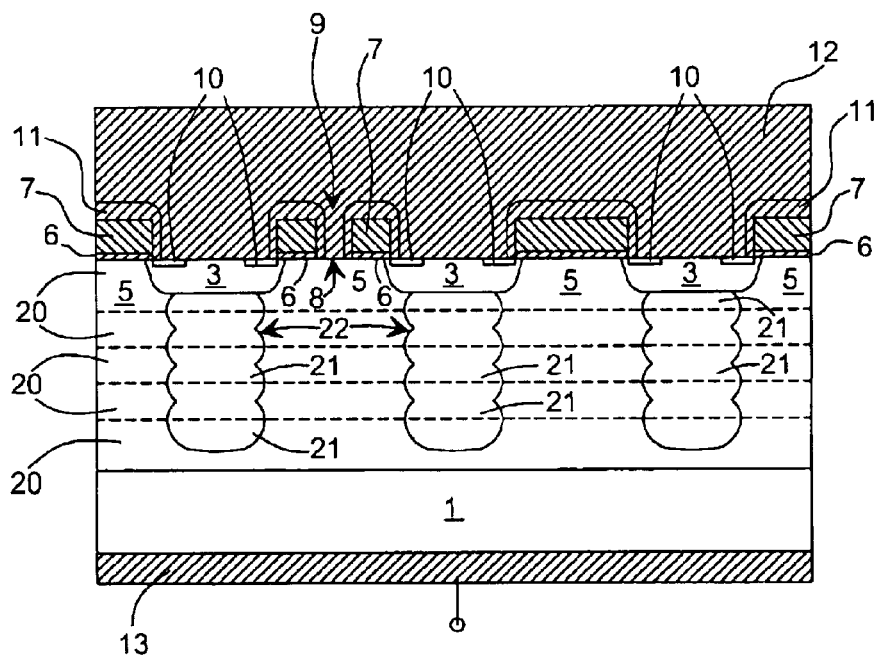
FIG. 15 is a view analogous to that in FIG. 14 but at a successive step of the manufacturing process of the device.

In FIGS. 12, 14 and 15 an integrated device according to a fourth embodiment of the present invention is shown which differs from the third embodiment because the masking and etch step of the polysilicon 7 and of the silicon oxide 6 of at least one elementary structure, that is of at least one polysilicon stripe 7 and at least one silicon oxide stripe 6, in the zone 8 does not provide the whole removal of the oxide and of the polysilicon in said zone 8. In fact in the zone 8 an opening 9 (for example comprised between 1 μm and 5 μm) in the polysilicon layer 7 and in the underlying silicon oxide layer 6 (FIGS. 12 and 14) is formed to allow the contact of the metal layer 12 with the underlying portion 5 of epitaxial layer 20 (FIG. 15); in such a way a formation of Schottky diodes in the zones 8 of the integrated device occurs the electrodes of which are constituted by the metal layers 12 and 13. The dielectric layer 11 covers the walls of the opening 9 to prevent the contact of the metal 12 with the polysilicon 7.

The width L2 of the stripes 6 and 7 in the zones 8 is preferably smaller than the typical width L1 of the stripes 6 and 7, as shown in FIG. 12; it is defined on the base of the breakdown voltage of the integrated device which is not lower than that of the integrated device without Schottky diodes, therefore the width L2 depends on the dopant concentration of the regions 3, on the thickness of the oxide, etc. With the width L2 smaller than the width L1 (e.g., if L1=11 μm L2 is comprised between 5 μm and 8 μm), at the thermal diffusion step of the P dopant of the body regions 3, after forming a suitable implant window, an alignment of said body regions 3 with the portion of the silicon oxide 6 of the zone 8 occurs so that portions of epitaxial layer 2 are not between the body regions 3 and the beginning of the layer 6, as shown in FIG. 14.

Preferably different zones 8 in more than one elementary structure are formed; said zones 8 are preferably aligned transversal to each other and are alternated longitudinally to the MOS elementary cells, as shown in FIG. 12.

Figure 13:
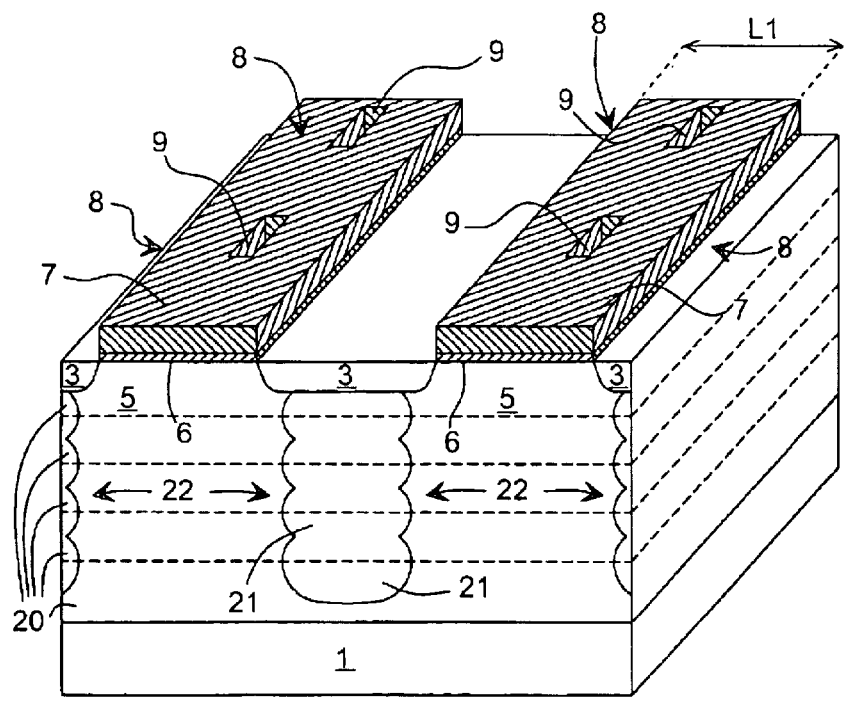
FIG. 13 is a perspective schematic view of a part of an integrated device according to a variant of the fourth embodiment of the present invention at one step of its manufacturing process.

In the variant of the fourth embodiment shown in FIG. 13 the only difference consists in that the width L2 of the stripes 6 and 7 of the zones 8 is equal to the typical width L1 of the stripes 6 and 7.

The integrated device is therefore formed by a MOS power transistor and by a Schottky diode arranged in parallel to the body diode. The above shown MD integrated device is particularly useful for use at high voltage.

While a preferred embodiment has been shown and described, it should be understood that a number of changes and modifications are possible. Accordingly, it is to be understood that the invention is not limited to the embodiment disclosed herein, and the right is reserved to all changes and modifications coming within the scope of the invention as defined in the appended claims.

We claim:

1. An integrated device comprising an MOS transistor and a Schottky diode formed on a semiconductor substrate of a first conductivity type, comprising:

a plurality of body region stripes of a second conductivity type which are adjacent and parallel to each other;

a first metal layer placed over said substrate and a second metal layer placed under said substrate;

a plurality of elementary structures parallel to each other, each one of which comprises first zones provided with a silicon oxide layer placed over a portion of said substrate which is between two adjacent body region stripes;

a polysilicon layer superimposed over said silicon oxide layer;

a dielectric layer placed over and around the polysilicon layer; and at least one of said plurality of adjacent body region stripes comprising source regions of the first conductivity type which are placed adjacent to said first zones of the elementary structures to form elementary cells of said MOS transistor, wherein said elementary structures and said body regions stripes extend longitudinally in a transversal way to the formation of the channel in said elementary cells of the MOS transistor, said first metal layer contacts said source regions, and at least one elementary structure of said plurality of elementary structures comprises at least one second zone adapted to allow the direct contact between said first metal layer and the underlying substrate portion arranged between two adjacent body regions stripes to form the Schottky diode.

2. The integrated device according to claim 1, wherein said at least one second zone comprises:

a further silicon oxide layer placed over said substrate portion;

a further polysilicon layer superimposed over said silicon oxide layer;

a further dielectric layer placed over and around the polysilicon layer; and a cavity formed in the further dielectric layer, in the further polysilicon layer and in the further silicon oxide layer, adapted to be filled up with said first metal layer for contacting said substrate portion, the walls of said cavity being covered with dielectric.

3. The integrated device of claim 1, wherein said substrate comprises a plurality of epitaxial layers of the first conductivity type, each one of said epitaxial layers comprising further regions of the second conductivity type for forming columns of said further regions of the second conductivity type under and in contact with said body region stripes.

4. The integrated device of claim 3, wherein said substrate comprises a layer of the first conductivity type with high dopant concentration with which said columns are in contact.

5. The integrated device of claim 3, wherein said substrate comprises a layer of the first conductivity type with high dopant concentration, a portion of a layer of said plurality of epitaxial layers of the first conductivity type being arranged between said columns and said layer of the first conductivity type with high dopant concentration.

6. The integrated device of claim 1, wherein said first conductivity type is N-type.

7. The integrated device of claim 1, wherein said first conductivity type is P-type.